(12) United States Patent
Krall et al.

(10) Patent No.: US 9,397,314 B2
(45) Date of Patent: Jul. 19, 2016

(54) THIN-FORM LIGHT-ENHANCED SUBSTRATE FOR OLED LUMINAIRE

(71) Applicant: Universal Display Corporation, Ewing, NJ (US)

(72) Inventors: Emory Krall, Philadelphia, PA (US); Kamala Rajan, Newtown, PA (US); Huiqing Pang, Bellevue, WA (US); Gregory McGraw, Yardley, PA (US); William E. Quinn, Whitehouse Station, NJ (US); Ruiqing Ma, Morristown, NJ (US); Julia J. Brown, Yardley, PA (US)

(73) Assignee: Universal Display Corporation, Ewing, NJ (US)

(*) Notice: Subject to any disclaimer, the term of this patent is extended or adjusted under 35 U.S.C. 154(b) by 0 days.

(21) Appl. No.: 14/581,586

(22) Filed: Dec. 23, 2014

(65) Prior Publication Data

US 2015/0214507 A1    Jul. 30, 2015

Related U.S. Application Data

(60) Provisional application No. 61/919,947, filed on Dec. 23, 2013.

(51) Int. Cl.
*H01L 51/52* (2006.01)
*H01L 51/00* (2006.01)

(52) U.S. Cl.
CPC ........ *H01L 51/5275* (2013.01); *H01L 51/0014* (2013.01); *H01L 51/0024* (2013.01); *H01L 51/0097* (2013.01); *H01L 51/5253* (2013.01)

(58) Field of Classification Search
CPC ............ H01L 51/5275; H01L 51/5253; H01L 51/0014; H01L 51/0024; H01L 51/0097
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,284,792 A * | 2/1994 | Forster et al. | 438/29 |
| 5,609,284 A * | 3/1997 | Kondratenko | 225/1 |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |

(Continued)

FOREIGN PATENT DOCUMENTS

| | | | | |
|---|---|---|---|---|
| JP | 2012-142182 A * | 7/2012 | | H05B 33/02 |
| WO | 2008057394 | 5/2008 | | |
| WO | 2010011390 | 1/2010 | | |

OTHER PUBLICATIONS

Baldo, et al., "Highly efficient phosphorescent emission from organic electroluminescent devices", Nature, vol. 395, pp. 151-154, 1998.

(Continued)

*Primary Examiner* — William Coleman
(74) *Attorney, Agent, or Firm* — Morris & Kamlay LLP

(57) ABSTRACT

Devices and techniques are provided in which a transparent substrate is scored to provide a non-planar surface on one side of the substrate. An OLED is then disposed on the other side of the scored substrate and optically coupled to the substrate. The scored surface provides improvements to outcoupling of light generated by the OLED, with little or no additional thickness relative to the OLED alone.

19 Claims, 16 Drawing Sheets

(56) References Cited

U.S. PATENT DOCUMENTS

| | | | |
|---|---|---|---|
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,984,934 | B2 | 1/2006 | Moeller et al. |
| 7,279,704 | B2 | 10/2007 | Walters et al. |
| 7,368,756 | B2 * | 5/2008 | Bruhns et al. .................. 257/93 |
| 7,431,968 | B1 | 10/2008 | Shtein et al. |
| 7,560,727 | B2 | 7/2009 | Ishikawa |
| 7,922,358 | B2 * | 4/2011 | von Malm .................... 362/293 |
| 7,968,146 | B2 | 6/2011 | Wagner et al. |
| 8,125,138 | B2 | 2/2012 | Luttgens et al. |
| 8,563,343 | B2 * | 10/2013 | Motoda .......................... 438/33 |
| 8,584,490 | B2 * | 11/2013 | Garner et al. ................... 65/112 |
| 8,716,749 | B2 * | 5/2014 | Kim et al. .................... 257/190 |
| 8,987,711 | B2 * | 3/2015 | Hiyama ............... G02B 5/0231 257/40 |
| 2003/0230980 | A1 | 12/2003 | Forrest et al. |
| 2004/0174116 | A1 | 9/2004 | Lu et al. |
| 2007/0230211 | A1 * | 10/2007 | Osato et al. ................... 362/600 |
| 2010/0201256 | A1 | 8/2010 | Xue et al. |
| 2010/0258821 | A1 | 10/2010 | Forrest et al. |
| 2012/0138980 | A1 * | 6/2012 | Kuo et al. ...................... 257/94 |
| 2012/0292652 | A1 * | 11/2012 | Yamae et al. ................... 257/98 |
| 2013/0244079 | A1 | 9/2013 | Mandlik et al. |
| 2014/0001448 | A1 * | 1/2014 | Naraoka et al. ................. 257/40 |
| 2014/0021450 | A1 * | 1/2014 | Young et al. ................... 257/40 |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

Moller, et al., "Improved light out-coupling in organic light emitting diodes employing ordered microlens arrays", Journal of Applied Physics 91, 3324 (2002); doi: 10.1063/1.1435422.

Yamae, et al., "High-Efficiency White OLEDs with Built-up Outcoupling Substrate", SID 2012 Digest, 694-697.

* cited by examiner

THIN-FORM LIGHT-ENHANCED SUBSTRATE FOR OLED LUMINAIRE

CROSS-REFERENCE TO RELATED APPLICATIONS

This application claims the benefit of U.S. Provisional Patent Application Ser. No. 61/919,947, filed Dec. 23, 2014, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to techniques for preparing or fabricating a substrate, and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

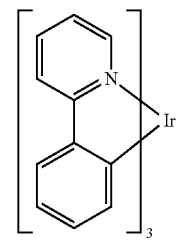

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, a light-emitting device may be fabricated by obtaining a transparent substrate, scoring a first side of the transparent substrate to form a non-planar surface on the first side of the substrate, and disposing an OLED adjacent to the second side of the transparent substrate. The OLED may be optically coupled to the transparent substrate. The OLED may be fabricated directly on the substrate, or it may be fabricated on a second substrate that is attached to the transparent substrate, such that the OLED is optically coupled to the transparent substrate. The scoring may be performed using a mechanical, chemical, laser, or other scoring process. The step of scoring the first side of the transparent substrate may include forming a pattern, such as parallel grooves, on the first side of the transparent substrate. The grooves may have planar sidewalls and angled bottom edges, curved sidewalls, and/or beveled sidewalls. A specific mechanical scoring edge may be selected based upon a desired shape of a groove formed by the step of scoring the transparent substrate. The pattern scored on the substrate may include an array of mesas on the transparent substrate. The mesas may have curved sidewalls, beveled sidewalls, secondary features on the mesa tops such as ridges around the edge of the mesa tops, and/or other features. The mesas may be about 1-100 μm thick. One or more scoring parameters may be selected, such as the knife angle, cutting speed, and/or cutting pressure for performing the scoring. The transparent substrate may be flexible, and/or may include a material such as PEN, plastic, and the like. The substrate may have a refractive index of 1.6-1.8. The substrate may be cleaned subsequent to the step of scoring the first side of the transparent substrate, and prior to the step of disposing the OLED on the second side of the transparent substrate. Other layers may be formed, such as a thin-film barrier over the OLED, a planarization layer disposed between the OLED and the substrate, and the like. The barrier, planarization layer, and/or other layers may have a refractive index in the range of about 1.6-1.8. The scoring process may be performed as part of a roll-to-roll fabrication process. The device may have a fill factor based upon the scoring, such as 1-Q, in which Q is the fractional portion of the substrate that is unaltered by the step of scoring the transparent substrate. Various scoring parameters may be used, such as depth, spacing, applied pressure, and the like.

In an embodiment, a light-emitting device fabricated according to the disclosed methods is provided. The device can be a consumer product, an organic light-emitting device, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
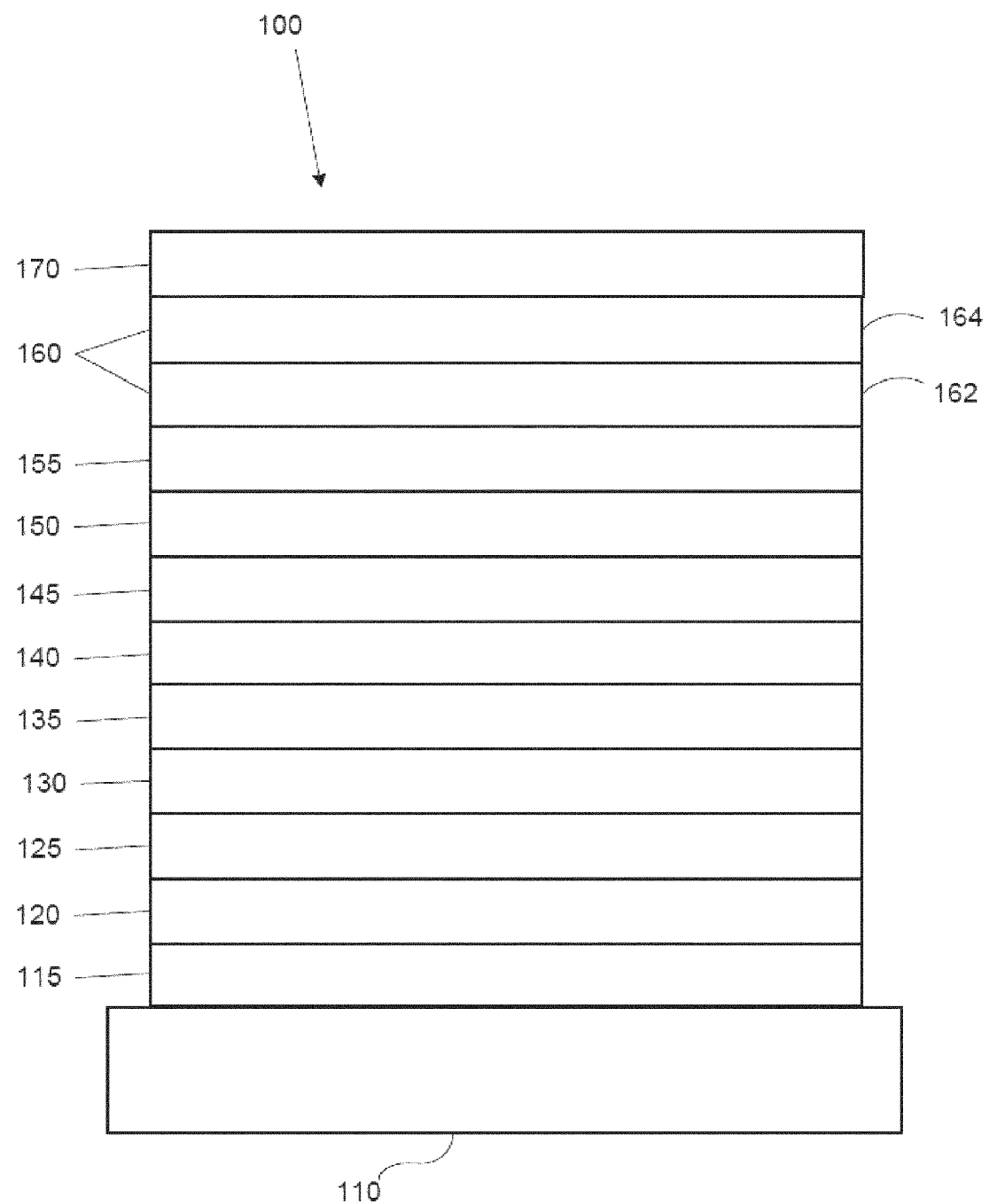
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
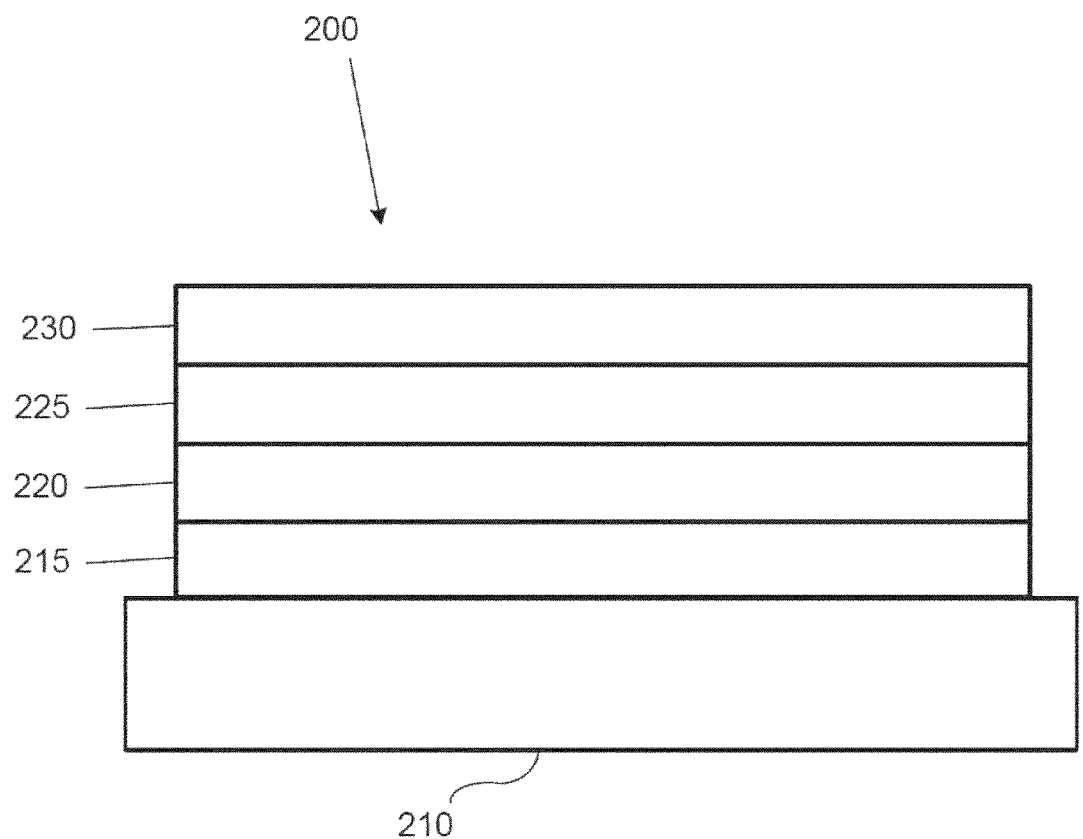
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

When used in a device such as a luminaire or a display, it may be desirable to extract as much light as possible from an OLED. There have been various techniques developed to extract light out of an OLED system. For example, a hemispherical dome or similar outcoupling device may be optically coupled to an OLED panel to extract substrate waveguided light. Similarly, light extraction blocks with various shapes and sizes have been demonstrated to provide outcoupling enhancement up to 1.8×. However, such techniques typically involve the use of a light extraction block or a dome with a thickness of several millimeters to tens of millimeters, depending on the size of the panel and the target outcoupling efficiency. Considering a typical OLED panel is less than 2 mm thick, the use of an outcoupling device may add undesirable height to the entire luminaire. Moreover, such light extraction blocks are often made of rigid materials such as glass or acrylic, which may add significant and undesirable weight to the OLED luminaire.

Additionally, an index matching fluid is often required to fill the air gap between the substrate and the outcoupling device. Therefore, such techniques may not be suitable for thin light-weight, and/or flexible OLED lighting applications.

Alternatively, microlens arrays (MLA) have been applied to OLED devices, and demonstrate relatively efficient light enhancement as described in, for example, Moller et al, J. Appl. Phys., 91 (2002) 3324 and U.S. Pat. Nos. 8,125,138, 6,984,934 and U.S. Patent Publication Nos. 2010/0258821 and 2010/0201256. Such techniques may offer a thin solution to light extraction for OLEDs, because the MLA sheets typically are in the range of hundreds of microns thick. If the MLA sheet is made of a relatively high index material, such as PEN plastic which has refractive index of about 1.7, and is used in combination with glass to form a hybrid substrate, about 50% light enhancement has been demonstrated. Such techniques are described, for example, in Yamae et al, SID, 51-4, 2012. A variation of a similar method is described in U.S. Pat. No. 7,560,727, in which a prism containing metal oxide nanoparticles was formed on the substrate.

Although MLA-type method may provide relatively thin-form outcoupling and relatively efficient light enhancement, the process for making an MLA sheet often involved high-temperature embossing, nano-imprinting, photolithography, and other techniques which may be technically difficult and expensive. In order to reduce the manufacturing cost while achieving a thin-form, efficient light extraction arrangement, embodiments disclosed herein provide methods to form arrays of mesas by mechanically scoring a substrate and the film. Embodiments disclosed herein may provide up to double the efficacy enhancement for an OLED device.

Embodiments disclosed herein provide relatively simple and low-cost techniques to fabricate thin-form light-enhanced substrates for OLED devices such as luminaires. In an embodiment, a pattern may be formed on a non-deposition surface of the substrate through scoring, such as by a mechanical cutting or scoring or similar technique. It may be preferred for the substrate to have a relatively high refractive index, such as PEN plastic which has a refractive index of about 1.7. More generally, a substrate refractive index in the range of 1.6-1.8 may be preferred. The scoring can be achieved through, for example, a flat-bed cutting machine, knife cutting tools, or any equivalent mechanical or other scoring technique. The scoring process may be controlled by a program such that the pressure and spacing may be adjusted before or during the scoring process. Arrays of mesa shapes may be formed on the substrate surface using various and variable cutting conditions, such as knife angle, cutting speed, and cutting pressure. Techniques disclosed herein may offer over twice the light outcoupling, without introducing additional thickness to the system. Such techniques may be particularly suitable for flexible lighting applications in which relatively soft substrates, such as plastics, are used.

In an embodiment, a transparent substrate may be obtained. A surface of the substrate, such as a non-deposition surface, may be scored to form a non-planar surface on the substrate surface. As used herein, "scoring" or a "scoring process" may refer to any non-additive process that changes a surface to be non-planar. Scoring may be subtractive, i.e., material may be removed from the surface, or it may be non-subtractive, such as where portions of a surface are compacted to create features in the surface. Example scoring techniques include mechanical scoring, such as via a knife blade or similar device, laser shaping, chemical scoring, and the like. As used herein, a "non-planar" surface refers to one that is not uniformly planar over the region of interest, such as over the region of a substrate being scored. A "non-planar" surface may have locally-planar regions that may or may not be parallel to the primary surface of a substrate. For example, when a knife blade is used to score a surface, it may create a triangular, trapezoidal, or similar furrow in the surface. The edges of such a furrow may be planar in that they are relatively flat and uniform through the furrow, but are non-parallel to the surface into which they are scored. Such a scored surface may be considered "non-planar" as disclosed herein since the surface is no longer uniformly planar after the scoring.

After a substrate is scored as disclosed herein, an OLED may be disposed adjacent to an opposite side of the substrate and optically coupled to the substrate. Thus, the features on the first side of a transparent substrate formed when the substrate is scored may provide outcoupling features for the OLED disposed on the opposite side of the substrate.

In an embodiment, a pattern may be formed on the scored side of the substrate. For example, two or more parallel grooves may be scored into the surface of the substrate. The grooves may have planar sidewalls that may be set at an angle of 15°, 30°, 60°, or up to 90°, or any angle therebetween, relative to the original substrate surface. The sidewalls of the grooves may continue into the groove until they meet, or the grooves may have angled bottom edges that are disposed at a different angle than the sidewalls. The grooves also may have beveled sidewalls. In another embodiment, the grooves may have curved sidewalls, such as where a knife with a curved blade is used to score the grooves.

In some embodiments, the particular shape of the groove or other feature formed when the substrate is scored may be selected prior to the step of scoring the substrate, and an appropriate mechanical scoring edge or other scoring mechanism may be selected to achieve the desired scoring pattern, shape, or other arrangement.

Shapes other than grooves may be formed during the scoring process. For example, an array of mesas may be formed on the substrate surface, such as by removing material around regions of the substrate so as to form protrusions from the substrate. Such mesas may provide outcoupling functionality similar to that observed for MLAs and similar structures. In an embodiment, additional features may be formed on the surface of mesas created on the substrate surface via etching. For example, additional grooves may be scored into the top, locally-planar surface of a mesa. As another example, additional mesa-like structures may be formed on the top of a mesa structure, such as by repeating a similar scoring process used to form the mesa, but in a limited area defined by the top of the initial mesa shape. As another example, a ridge may be formed on or around the top edge of a mesa, which is elevated above the locally-planar top of the mesa. Mesas and similar features disclosed herein may have a thickness, i.e., a height above the lowest scored point of the substrate used to form the mesa, of about 1-100 µm.

In an embodiment, the parameters used to score a substrate surface may be selected and/or varied prior to or during the scoring process. For example, when a mechanical scoring technique is used, the knife angle, cutting speed, cutting pressure, or combinations thereof may be selected to achieve a specific scored pattern or feature on the substrate surface. As a specific example, similar features may be achieved by using a higher cutting angle and lower cutting pressure, or a lower cutting angle and higher cutting pressure. Alternatively or in addition, different features may be achieved by using different parameter values, such as where differently-shaped grooves are achieved by using a different cutting angle.

Techniques disclosed herein may be applied to various types of substrates and substrate materials, including flexible substrates, PEN substrates, plastic substrates, and the like.

In an embodiment, the substrate may be cleaned after it is scored, and prior to deposition of an OLED on the opposite side of the substrate. A cleaning step may be useful, for example, to remove excess material created during the scoring process. Such material may interfere with OLED deposition and/or the optical interface between the OLED and the substrate. Various cleaning techniques may be used, including mechanical, chemical, forced air, and the like.

In an embodiment, a thin-film barrier may be disposed over the OLED and/or the substrate, for example after the OLED is disposed adjacent to the opposite side of the substrate. Various thin-film barriers may be used, some of which are described in, for example, U.S. Pub. No. 2013/0244079 and International Application No. PCT/US2014/043538, the contents of which are incorporated by references in their entirety.

Techniques disclosed herein may be performed on individual substrates, or they may be performed as part of a roll-to-roll process. For example, a flexible substrate may be processed in a roll-to-roll technique, during which one side of the substrate may be scored as previously described as the substrate is unrolled, processed, and re-rolled. Similarly, OLED materials may be deposited on the other side of the substrate during the same roll-to-roll process. The deposition of OLEDs during a roll-to-roll process may be performed using conventional techniques as would be readily understood by one of skill in the art. Scoring processes as disclosed herein may be performed as described with respect to an arbitrary substrate, for example, as the substrate is unrolled adjacent to a mechanical scoring mechanism. In some embodiments, the scoring process may be partially or entirely performed due to movement of the substrate itself, in contrast to non roll-to-roll techniques in which the scoring process may be performed due to movement of a scoring apparatus relative to the substrate.

Other layers may be fabricated in addition to, or as part of, the OLED that is disposed on the opposite side of the substrate. For example, a planarization layer may be disposed between the substrate and the OLED to improve the optical communication between the two and thus improve outcoupling. The planarization layer may have an index of refraction similar to that of the substrate, such as in the range of 1.6 to 1.8. As another example, a barrier layer may be disposed between the substrate and the OLED, so as to prevent moisture, oxygen, or the like from contacting the side of the OLED disposed closest to the substrate. Similar to the planarization layer, the barrier layer may have a refractive index in the range of 1.6 to 1.8 to improve outcoupling from the OLED into the substrate.

Embodiments disclosed herein may achieve various degrees of outcoupling, fill factors, and other effects and characteristics of OLEDs. For example, various fill factors may be achieved based on the specific pattern and/or the amount of the substrate that is scored. The fill factor may be approximately equal to $1-Q$, in which Q is the fractional portion of the substrate that remains unaltered after the substrate is scored. For example, if the substrate is scored such that 90% of the substrate is unscored, i.e., not scored or otherwise affected by the scoring process, then the resulting device may have a fill factor of about $1-0.9$, i.e., 0.1.

As a specific example, a Dupont Teijin Q65FA PEN (polyethylene naphthalate) sheet may be used as a substrate. As previously described, a PEN sheet may be advantageous for use as a substrate with embodiments disclosed herein because it has a refractive index of about 1.7 after biaxial stretching and a high glass transition temperature Tg of about 150 C. The high refractive index may allow more light to be coupled out from the anode/organic waveguided mode for a bottom-emission OLED, and the high Tg allows higher process temperature. Other materials that have high index may also be used here, such as polycarbonate, polyethylene, polypropylene (PP), polystyrene (PS), poly ethylene terephthalate (PET), polyethersulfone (PES), polyimide, polymer film doped with high-index nanoparticles, etc. The PEN may come with primer coating or surface treatment that is associated with roll-to-roll process on one or both sides of the sheet. The coating and/or treatment may have a low-index polymer, e.g. n<1.5. This side may be used as the scoring side, while the non-coated side may be ideal for OLED growth.

Figure 3A:
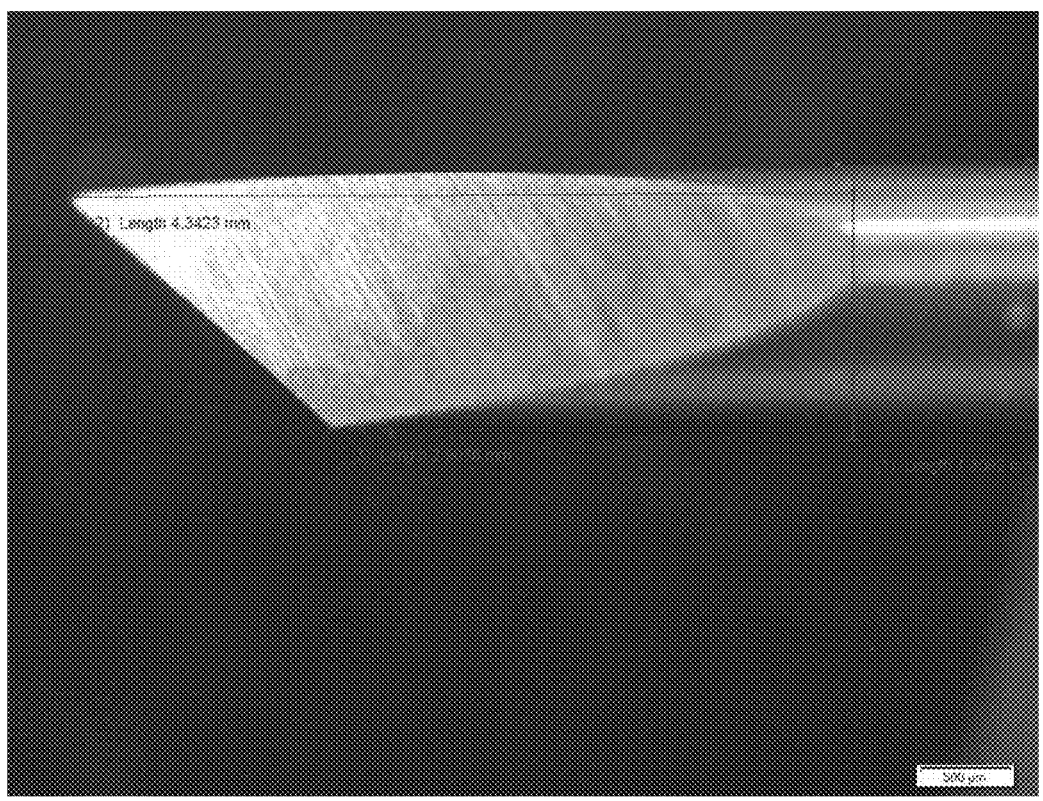
FIGS. 3A and 3B show images of an example cutting knife suitable for use with embodiments disclosed herein.

To perform a scoring process as disclosed herein, a flat-bed cutting machine may be used to score patterns on the substrate. As an example, the Graphtec flat-bed cutting machine may be used. The CB 15U-5 knife wasuto score the pattern on PEN substrate. Images of the knife are shown FIGS. 3A and 3B. In the example, the knife has a cutting angle of approximately 24 degrees. The knife may get blunt after a few times usage depending on the substrate type and cutting conditions, and the knife may be replaced routinely to ensure a reproducible cutting pattern. Lubrication and control of substrate temperature may extend blade lifetime and improve the quality of cuts. Additionally, mounting the non-scored side of the plastic sheets on an optically flat carrier plate prior to scoring reduces the formation of defects on the OLED growth side due to the application of cutting force.

The PEN substrate may be taped down or otherwise attached to the machine bed, with low-index coated/treated side facing up for scoring. The pattern may be pre-programmed in the computer that controls the cutting machine. A grid pattern may be tested where the pitch is set to be 75 µm and the knife goes in two perpendicular cutting paths.

Figure 4:
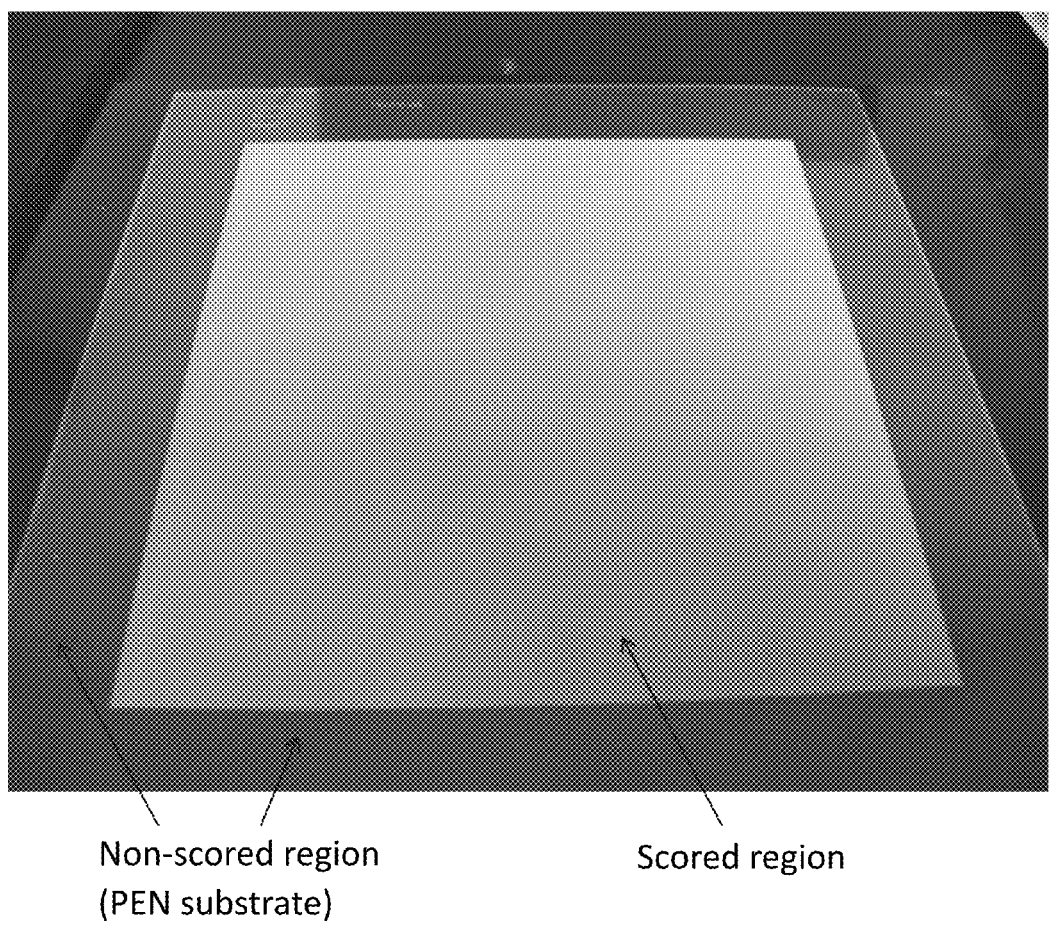
FIG. 4 shows an image of a 6 inch by 6 inch PEN substrate after scoring according to an embodiment.
Figure 5:
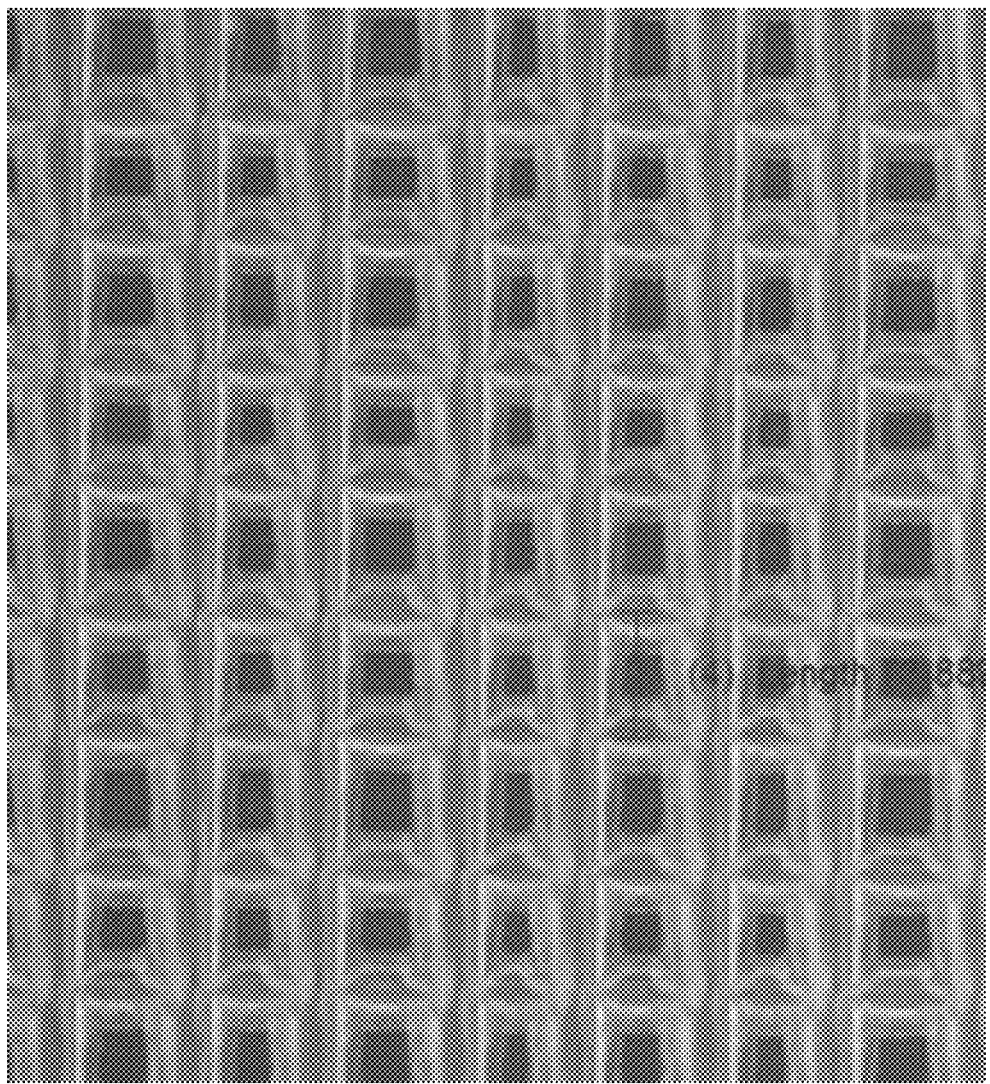
FIG. 5 shows a microscopic image of the top view of scored region according to an embodiment.
Figure 6:
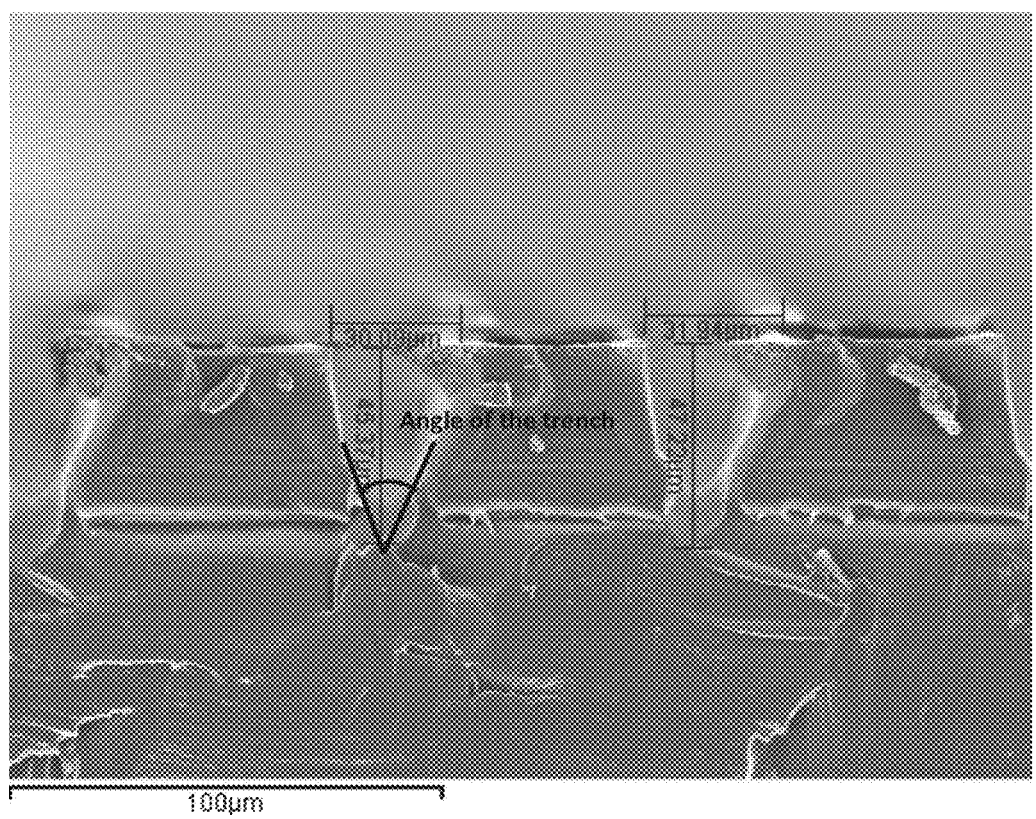
FIG. 6 shows a SEM image of a cross-section of a scored region according to an embodiment.

A photo image of a 6 inch by 6 inch PEN substrate after scoring is shown in FIG. 4. The scored region generates a diffused optical effect. This pattern was created by using cutting speed level 5 and cutting force level 3. Microscopic image of the top view of the scored region is shown in FIG. 5 with measured dimension. As shown, the scoring process may generate arrays of mesas, with the pitch between the mesas being approximately 75 µm. FIG. 6 shows the SEM image of the cross-section of the scored region. The depth of the cut is between 45-50 µm, and the gap between two adjacent mesas is approximately 30 µm. The calculated angle of the trench is approximately 36 degree. Note that, this is larger than the cutting angle of the knife, due to the relief of residual stress in the substrate from the biaxial stretching process used to manufacture it.

Figure 7:
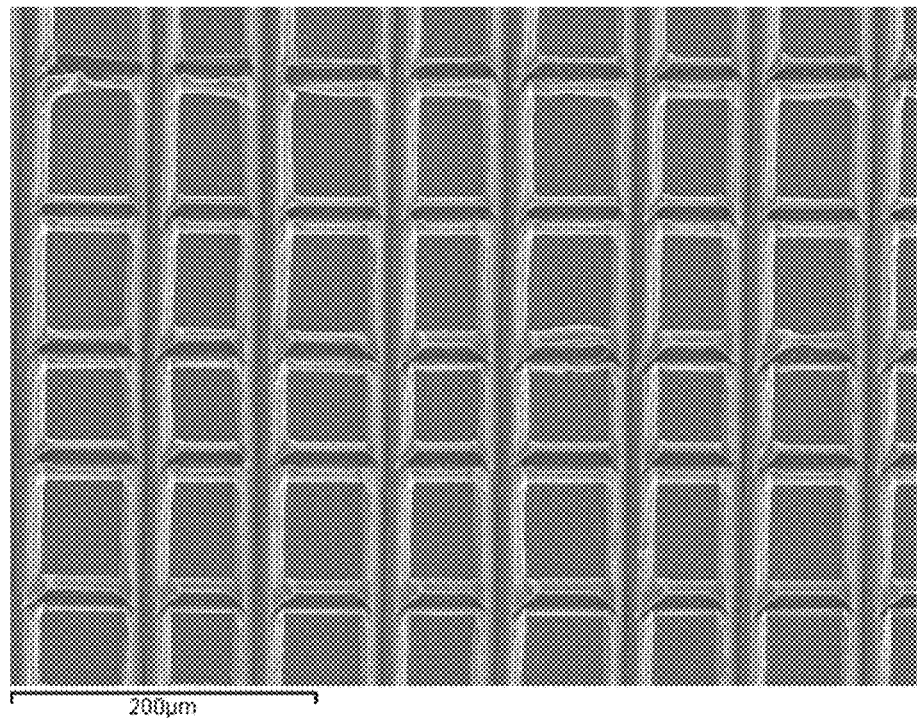
FIG. 7 shows SEM images of the top view (top) and tilted side view (bottom) of the a scored region according to an embodiment.
Figure 7:
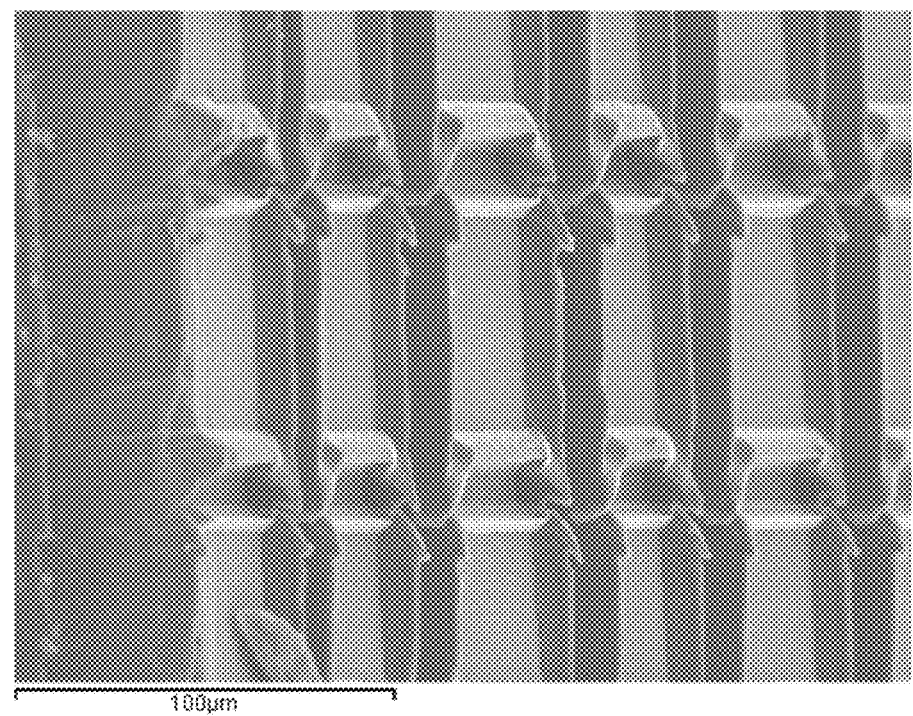

Notably, the exact shape and height of the mesa may be varied when applying different cutting pressure and speed as previously described. For example, FIG. 7 shows the SEM images of top view (top figure) and tilted side view (bottom figure) of the patterns cut with force level 1, i.e., a lower force. Larger force and/or higher speed tend to create non-uniformity and more debris to the surface pattern. The speed, pressure and pitch may be optimized for different types of plastic, such that a uniform and repeatable pattern may be acquired.

Figure 8:
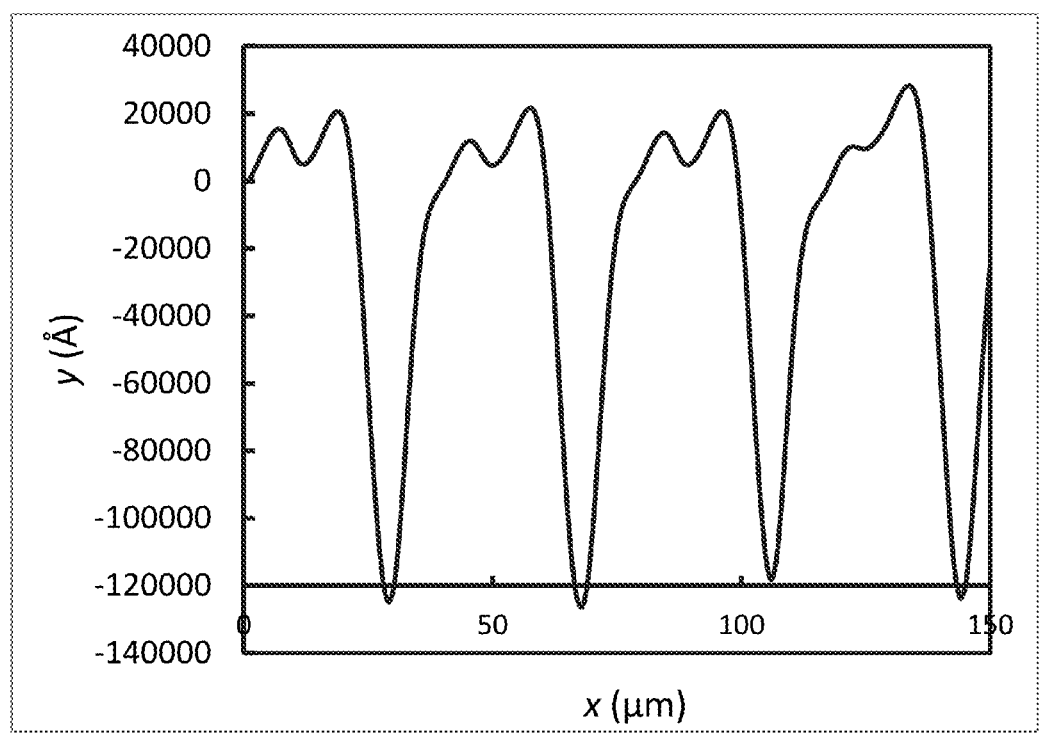
FIG. 8 shows a profilometer trace of a scored region topography according to an embodiment.

A contact profilometer trace of a structure like that shown in FIG. 7 appears in FIG. 8. The scan shows height variation, measured in Angstroms, along a straight line parallel to a cutting axis. As the PEN is scored, the blade pushes material out of its path like a plow. This material forms ridges that rise roughly 2 µm above the substrate surface. These ridges are apparent in the profile measurement and they can be clearly seen along the perimeter of the top surface of the mesas imaged in FIG. 7. This and other secondary features generated by the cutting process may further enhance outcoupling performance beyond that of the basic mesa structure.

Figure 3B:
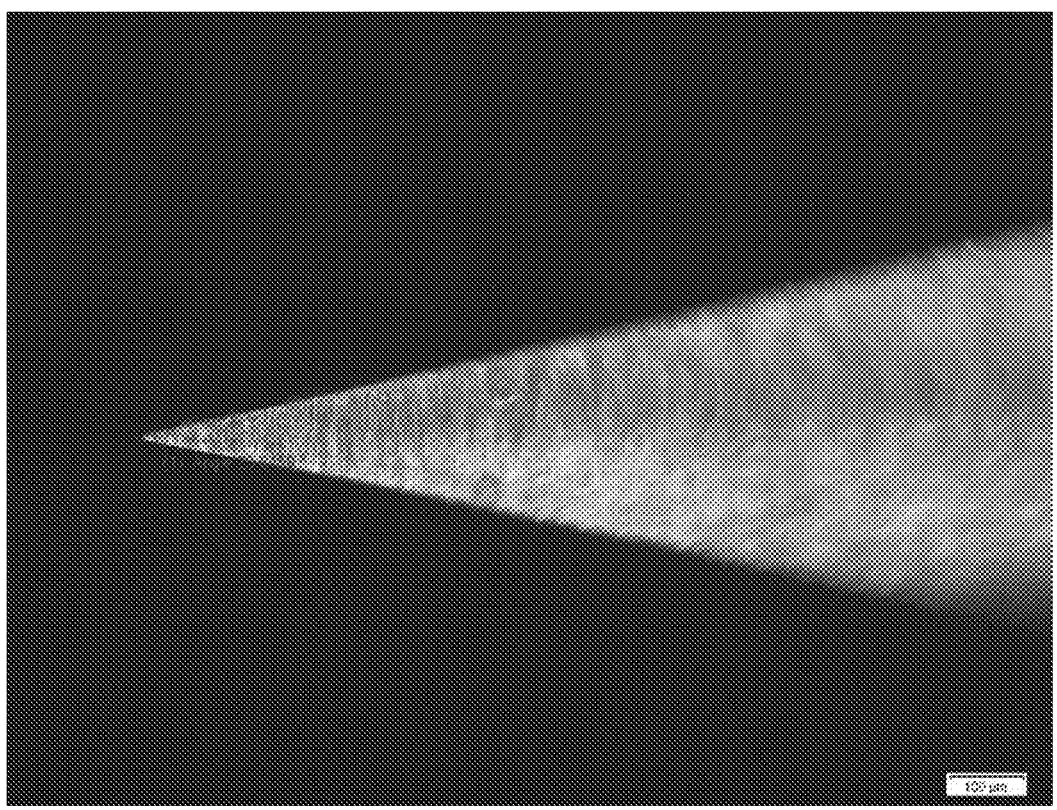
Figure 9A:
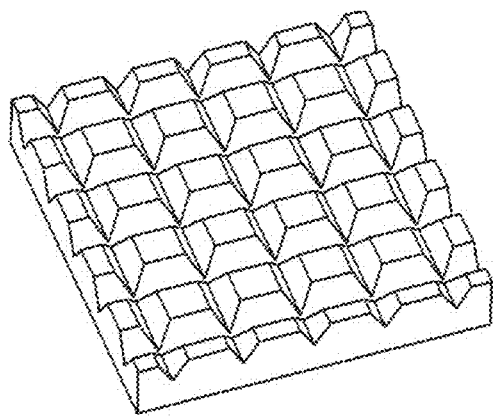
FIGS. 9A, 9B, and 9C show examples of mesa geometries that can be achieved using shaped tools according to embodiments disclosed herein, with geometries including straight sidewalls, dihedral sidewalls, and curved sidewalls, respectively.
Figure 9B:
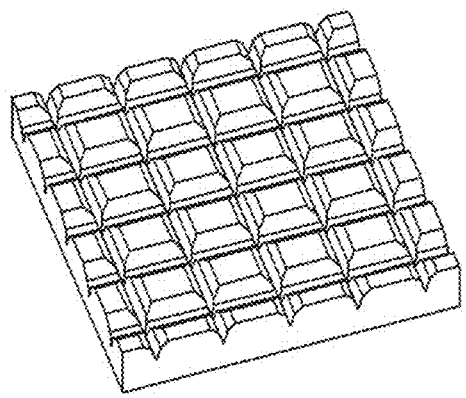
Figure 9C:
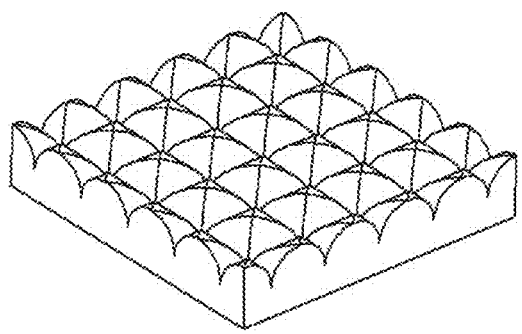

As previously described, different shapes of grooves or other features may be formed using shaped cutting tools. A basic outcoupling array like that studied in the experimental section is shown in FIG. 9A. This is cut using a knife with a cutting edge formed by flat sides, with a constant angle relative to each other, as shown in FIG. 3B. Trenches scored by this knife produce mesas with angled, planar sidewalls. Dihedral sidewalls, shown in FIG. 9B, can be formed by either retracing the cutting path with flat blades of different cutting angles, or by using a blade with beveled sides in a single pass. Features with sidewalls of convex curvature, such as those in FIG. 9C, can be produced by a blade with concave sidewalls, such as that of a hollow ground knife edge. Cutting tools can be designed to produce a range of curved or polyhedral features in order to produce a desired outcoupling effect. More generally, cutting tools such as gouges, chisels, mills, and saw blades may be used in place of a knife to form features into the substrate. These can also be designed to provide specific sidewall topographies.

Figure 10A:
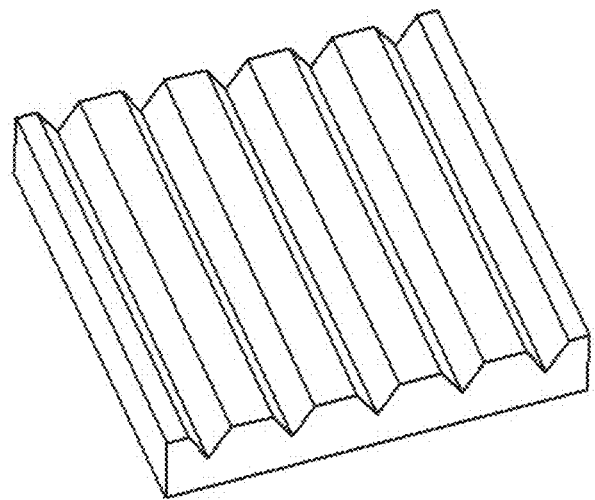
FIG. 10A shows an example of an outcoupler geometry including an array of parallel grooves according to an embodiment.
Figure 10B:
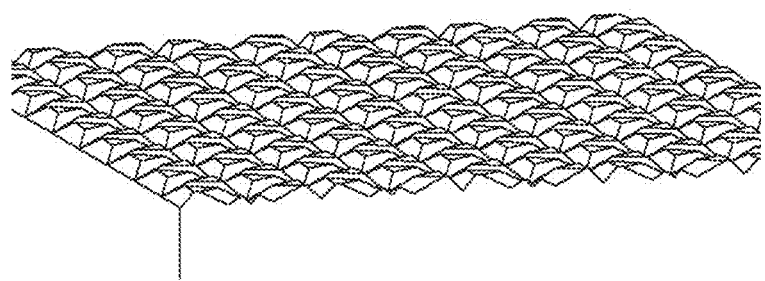
FIG. 10B shows an example of an outcoupler geometry including a repeating pattern of mesas with triangular top surfaces according to an embodiment.

As previously described, both the shape and arrangement of outcoupling features can be controlled by changing the pattern of cuts. An array of parallel grooves like that shown in FIG. 10A, can be fabricated by scoring the substrate at constant intervals in a single direction. Such a configuration may be particularly suited, for example, to embodiments in which the devices are partially or entirely fabricated during a roll-to-roll process. While this structure may not outcouple light as effectively as one with multiple scoring directions, it is easily adaptable to roll-to-roll processing and may, therefore, be very cost effective to employ. Alternately, a repeating pattern of mesas with triangular top surfaces can be formed by cutting at regular intervals in three different directions, each offset 60° from the others. This pattern, shown in FIG. 10B, has the advantages such as a high density of outcoupling features and a greater degree of azimuthal light outcoupling uniformity than a rectangular grid of mesas.

Continuing the illustrative example, after the surface of the PEN is scored, the substrate may be sent for cleaning. The cleaning process may involve wet chemical cleaning, such as ethanol spray, DI water rinse and dry. The cleaning process may further involve a dehydration baking, such as an oven baking at over 100° C. for at least 20 minutes. Alternatively, the substrate may be dry cleaned, e.g., $O_2$ plasma treatment, and/or vacuum baking. The purpose of the cleaning is to remove all the surface debris that may be generated during the scoring, and the glue residual from the protection liner.

The scored substrate may be sent for OLED growth directly after cleaning. Alternatively, a planarization layer may be applied on top of the non-scored surface to smooth the surface. As previously described, the planarization layer may be preferred to have a refractive index higher than 1.7, such that there is no light loss at the interface between the planarization layer and the PEN substrate. In addition, the planarization layer is required to be thick enough to cover the surface roughness of the non-scored PEN surface to reduce shorting for OLEDs.

In order to ensure long lifetime of the OLED device built on plastic, a passivation layer may be disposed on top of the non-scored PEN substrate, or the planarization layer.

Examples of passivation layer may be sputtered AlZnOx, or single-layer barrier deposited through PECVD (see Universal barrier related patents). The passivation layer is preferred to have a refractive index higher than 1.7 and a low WVTR.

Figure 11A:
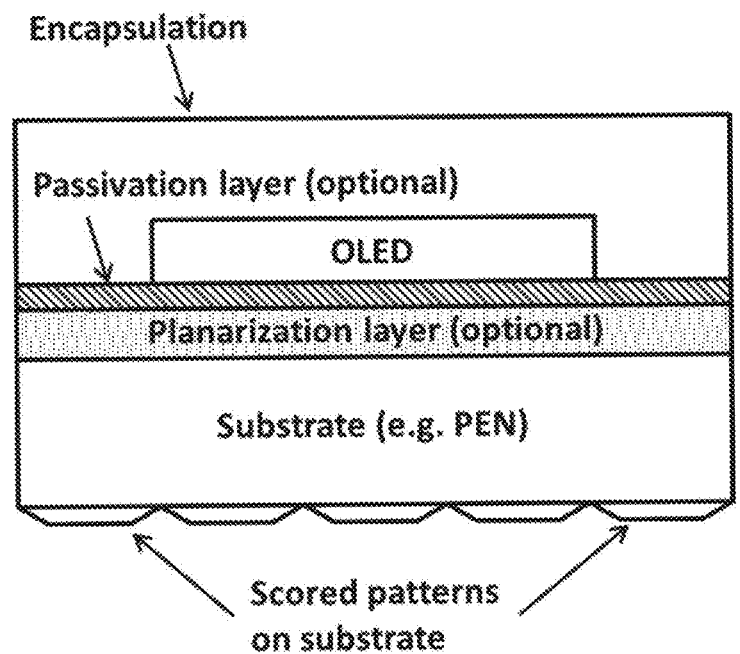
FIGS. 11A and 11B show illustrations of system structures with and without a planarization or passivation layer according to an embodiment, respectively.
Figure 11B:
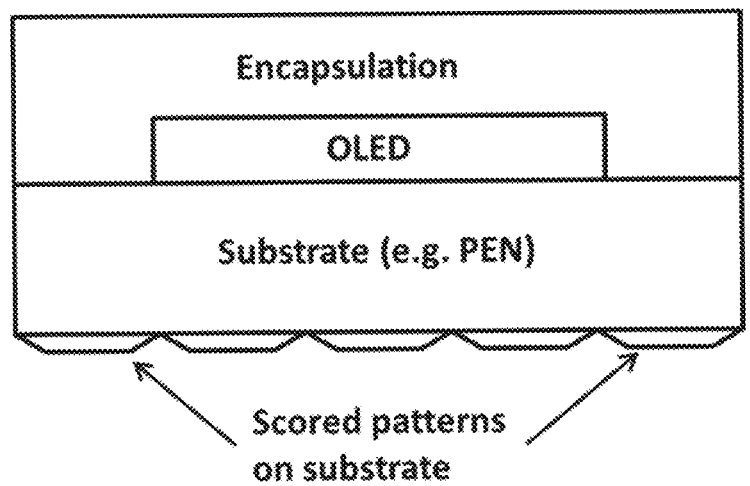

The scored substrate may receive surface treatment, such as $O_2$ plasma treatment and/or UV Ozone treatment prior to OLED growth. The substrate may also be baked at elevated temperature to remove moisture. OLEDs may be deposited on the non-scored side of the substrate, and followed by encapsulation. Encapsulation may be conventional glass encapsulation, or more preferably, thin-film encapsulation such that the entire luminaire may be flexible. FIGS. 11A and 11B show the system structure with and without planarization layer/passivation layer respectively.

In previously-described examples, an OLED is shown and described as being fabricated directly on or over a scored substrate, such as a plastic substrate. Alternatively or in addition, an OLED may be fabricated on a separate, second transparent substrate, and then optically coupled to the scored transparent substrate. For example, it may be attached to the scored substrate by laminating the substrates together with transparent glue or similar techniques. It may be preferred that the second substrate and the coupling glue have the same or similar refractive index as the scored transparent substrate. Thus, a substrate may be scored using any of the techniques disclosed herein, and a separate OLED or combined OLED/substrate may be attached to the scored substrate.

Experimental

Simulation

The outcoupling performance of scored PEN substrates was estimated using an optical ray-tracing Monte Carlo model using TracePro 3.3 from Lambda Research (Littleton, Mass.).

Figure 12A:
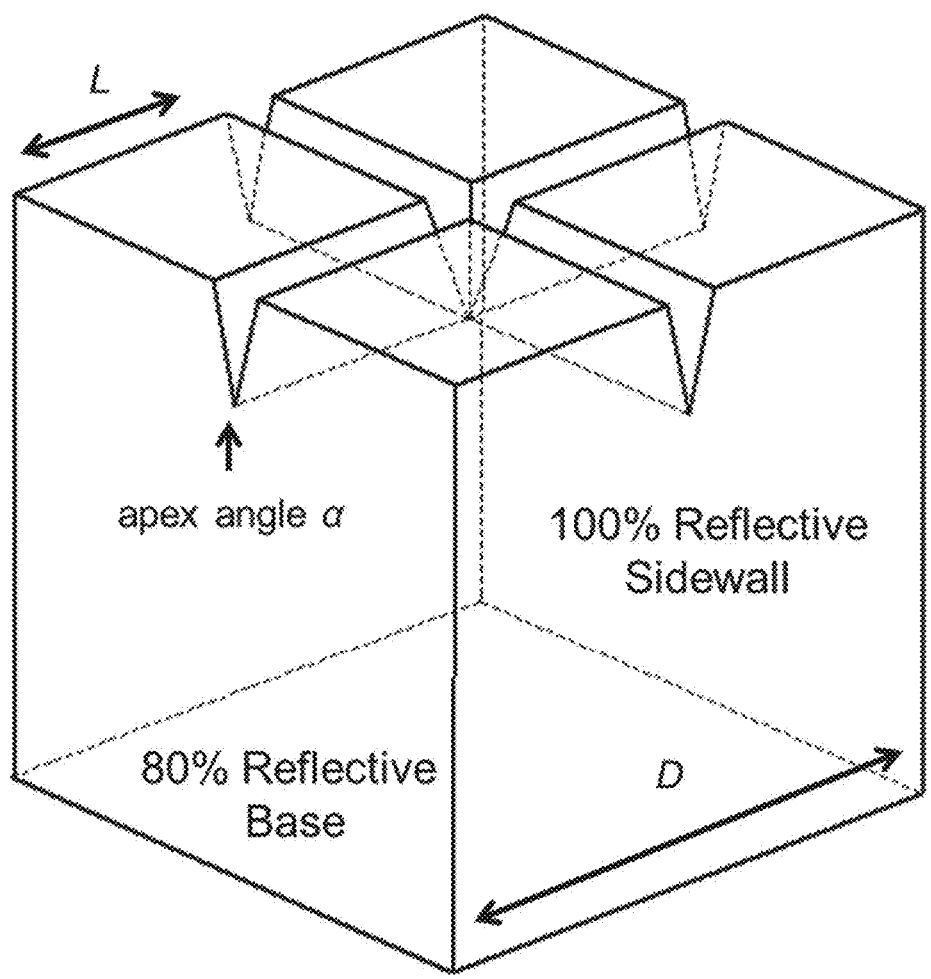
FIG. 12A shows an illustration of an optical model structure according to an embodiment.

The simulated volume is shown in FIG. 12A. It includes a square prism with two triangular grooves cut into its upper surface, corresponding to the substrate-to-air interface. The grooves are orthogonal and intersect in the center. The vertical sidewalls of the volume are perfectly reflective to enforce symmetric boundary condition consistent with a periodic surface. The groove shape is defined by two parameters, the apex angle and fill factor. The apex angle, $\alpha$, is the angle between the two sidewalls of the groove that intersect at its bottom. The fill factor F is defined as $F=(D^2-4*L^2)/D^2$, where D is the side length of the volume and L is the length between the upper edge of the groove and the upper edge of the nearest parallel vertical sidewall. This may be physically interpreted as the fraction of the upper surface cross sectional area that is covered by non-horizontal surfaces, i.e. by outcoupling features. Parameters F and $\alpha$ are the same for both grooves on a given structure.

Figure 12B:
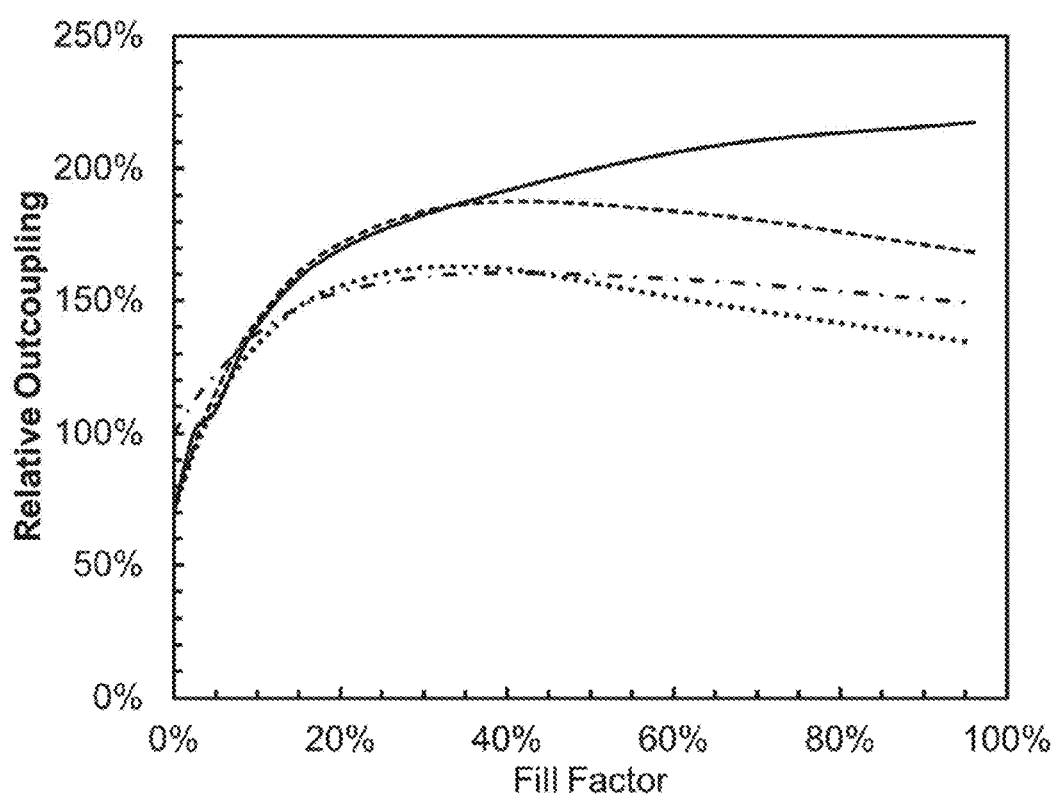
FIG. 12B shows simulated outcoupling efficiencies for an optical model according to an embodiment.

Light enters the volume through its lower surface, corresponding to the junction between the transparent conducting oxide (TCO) electrode of the OLED and the substrate. The trajectories of rays are stochastically chosen to represent a Lambertian distribution of light entering the substrate. The bottom surface acts as an 80% reflective specular mirror to incident light on the substrate side. The substrate refractive index is either n=1.7 or n=1.5. Outcoupling efficiency is the product of the fraction of light entering the substrate that outcouples to air and the fraction of light generated in the OLED that enters the substrate. The later ratio is calculated using Berreman's Matrix Method for both the n=1.5 and n=1.7 substrates. The refractive index of the TCO layer is assumed to be n=1.9. High index substrates can outcouple light more efficiently because they reduce the reflective loss between the TCO layer and the substrate. While the reflective loss between the substrate and air is greater for a high index substrate, this can be mitigated with outcoupling structures. Outcoupling efficiencies shown in FIG. 12B are normalized to a standard OLED with a planar substrate of n=1.5.

The sidewalls in grooves with small a are most effective at outcoupling rays light following trajectories close to the plane of the substrate, while horizontal surfaces outcouple light rays close to the substrate normal. Optimal outcoupling is achieved with $\alpha=90°$ and F=100%. A 2.17× efficiency enhancement over a standard OLED can be achieved for a substrate with n=1.7. The sides of the groove form a 45° degree angle with the substrate normal in this case, so both near in-plane and near normal light rays are outcoupled. Grooves with smaller $\alpha$ are progressively less effective. These groove patterns, however, do not require unity F for optimal outcoupling, since a mixture of oblique and horizontal features will outcouple the most light. Experimental substrates have $\alpha$ between 30° and 45°. A substrate with n=1.7, $\alpha=45°$, and F=40% is expected to provide an outcoupling enhancement of 1.88.

Experiment Results

In order to verify the simulation results, a scored PEN substrate as described above was prepared without planarization layer or passivation layer. The PEN is 125μ thick Dupont Teijin Q65FA, and 2D scoring was performed at speed level 5 and force level 3, with a pitch of 75 μm. The fill factor of the pattern is approximately 64%, with a cutting angle of approximately 37 degrees. White bottom-emission OLED was deposited on the non-scored side of the PEN substrate and a reference glass substrate. The glass substrate has a refractive index of ~1.5 and a thickness of 0.7 mm. The active area of the OLEDs is 1 $cm^2$. The exact OLED structure is not important here for a relative comparison, and any OLED structure may be used.

Figure 13:
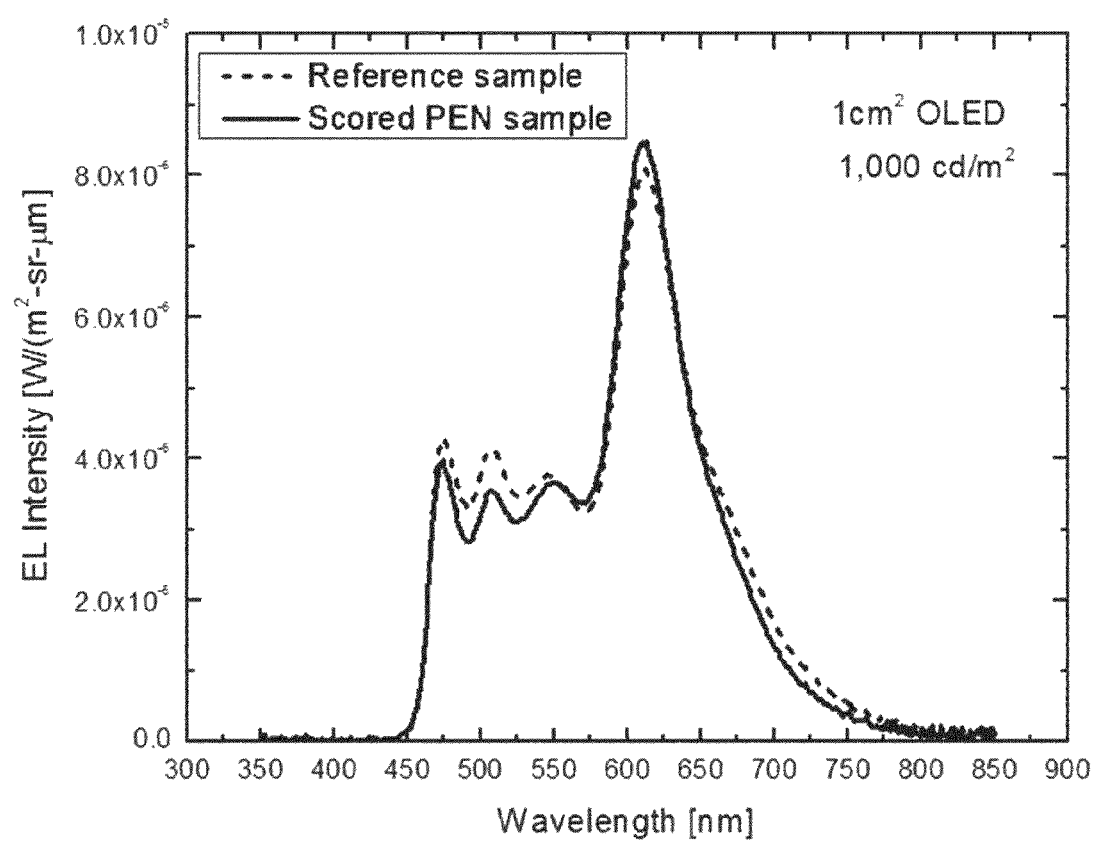
FIG. 13 shows simulation results of outcoupling enhancement as a function of fill factor for various cutting angles and two substrate indexes according to an embodiment.

Table 1 summarizes the device performance of the reference sample and the one grown on scored PEN. All data was measured inside a 6" integrating sphere. The edges of the glass were blocked with black tapes so that only the surface light is collected. This is to be comparable with the thin PEN substrate which barely has any edge light. Both devices were encapsulated with conventional cover glass and getters were placed on the cover glass to absorb moisture. The reference sample demonstrated 31.6 lm/W and 44.2 cd/A at 1,000 $cd/m^2$, with CIE (X,Y)=(0.448, 0.422), CRI=80, CCT=2,961 K, and Duv=0.005. In particular, the current density and operating voltage of the reference sample driven at 1,000 $cd/m^2$ are 2.26 $mA/cm^2$ and 4.4 V. This is quite typical device performance of a white OLED built on conventional planar glass substrate, without any external outcoupling strategy. The equivalent OLED grown on scored PEN sample without any planarization layer or passivation layer achieved 64.1 lm/W and 84 cd/A at 1,000 $cd/m^2$, with CIE (X, Y)=(0.461, 0.419), CRI=83, CCT=2,749, and Duv=0.003. This device was operating at 1.19 $cd/m^2$ and 4.1 V at 1,000 $cd/m^2$, where the current density is almost half of the reference sample. This leads to a significant efficacy enhancement over the conventional reference device, and we demonstrated over 2.0× efficacy enhancement by using the 125 μm thick scored PEN substrate. In addition to the light enhancement, the chromaticity of the two samples are also different, where the emission color from the scored PEN sample is red shifted comparing to the reference sample. FIG. 13 plots the spectra of the two samples collected inside the integrating sphere at 1,000 $cd/m^2$. It is noticeable that the scored PEN sample shows a higher red peak at 612 nm than the reference, while lower blue peaks at 474 nm and 508 nm. This leads to a higher CRI, lower CCT and smaller Duv, which satisfies the Energy Star criteria better. This warm white tone is favored in most of the western countries, and the less blue contribution is desired for health related applications.

TABLE 1

Summary of the device performances of a reference OLED and a device grown on scored PEN.

|  | Reference sample | Scored PEN sample |
|---|---|---|
| 1931 CIE(x, y) | (0.448, 0.422) | (0.461, 0.419) |
| CRI | 80 | 83 |
| Duv | 0.005 | 0.003 |
| CCT [K] | 2,961 | 2,749 |
| Voltage [V] | 4.4 | 4.1 |
| Luminance [cd/m$^2$] | 1,000 | 1,000 |
| Current Density [mA/cm$^2$] | 2.26 | 1.19 |
| Luminous Efficiency [cd/A] | 44.2 | 84 |
| Power Efficacy [lm/W] | 31.6 | 64.1 |
| Power Efficacy Enhancement | 1.0 | 2.03x |

Notably, the above results demonstrate the efficacy enhancement of the film, which includes the voltage reduction when operating at lower current density.

Figure 14:
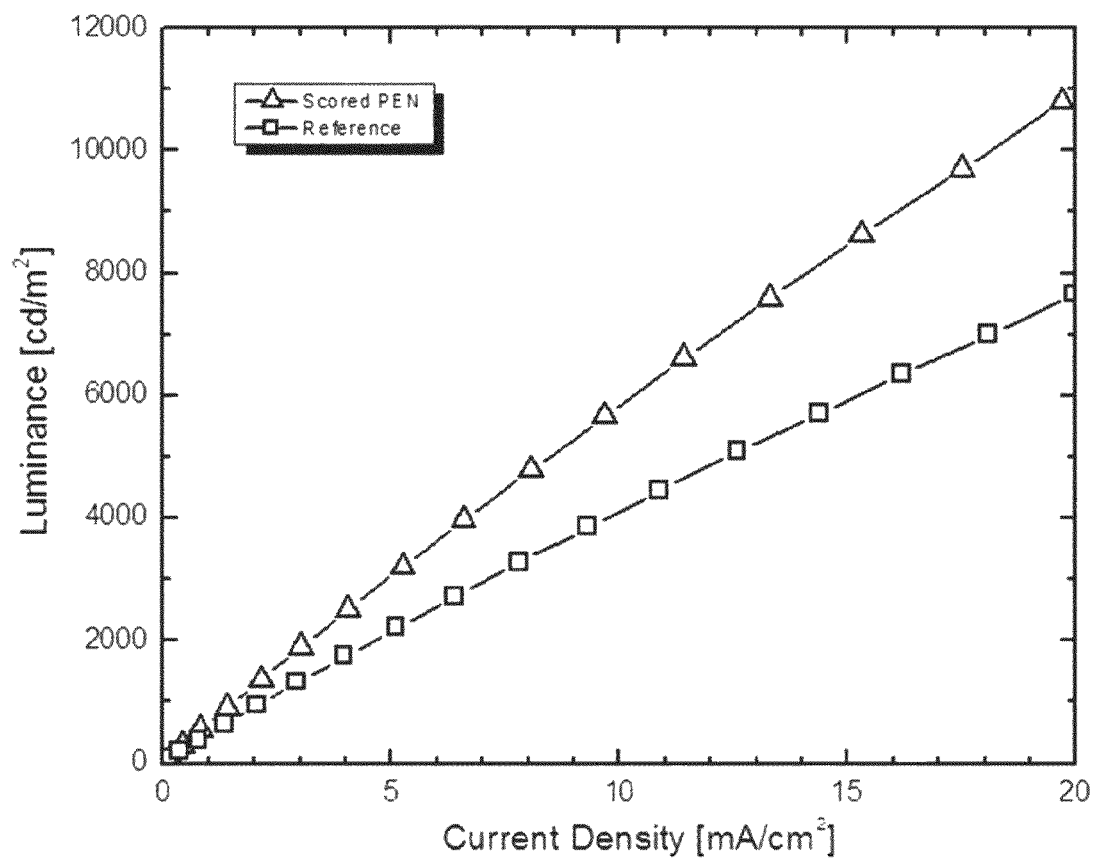
FIG. 14 shows the spectra of a reference sample and scored PEN sample measured at 1,000 cd/m$^2$ inside a 6" integrating sphere according to an embodiment.

To extract the optical enhancement so as to compare with the simulation prediction, we measured the luminance of the two samples at normal incidence (assuming Lambertian distribution) using a PR705 photodetector, and the luminance vs. current density curves are plotted in FIG. 14. As can be seen here, depending on the operation regime, the optical enhancement of the scored PEN sample over reference sample varies. For example, at 2 mA/cm$^2$, the reference sample is measured to be 941 cd/m$^2$, and the scored PEN sample is at 1,350 cd/m$^2$, and therefore the optical enhancement is 1.44×; at 10 mA/cm$^2$, the reference sample is measured at 4,105 cd/m$^2$, and the scored PEN sample is at 5,834 cd/m$^2$, and therefore the optical enhancement drops to 1.42×. This is close to the simulation prediction of a 1.34× outcoupling enhancement for a scored PEN substrate with $\alpha=36°$ and F=64%.

This method may be particularly suited for manufacturing highly-efficient flexible OLED lightings. It is worth noticing that the 2.0× efficacy enhancement was achieved without adding any external outcoupling strategy, and the total thickness of the system may be kept less than 150 μm.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A method of fabricating a device, the method comprising:
   obtaining a transparent substrate having a first side and a second side;
   scoring, with a subtractive scoring process, the first side of the transparent substrate to form a non-planar surface on the first side of the substrate; and
   disposing an OLED adjacent to the second side of the transparent substrate;
   wherein the OLED is optically coupled to the transparent substrate.

2. The method of claim 1, wherein the scoring the first side of the transparent substrate is performed using a mechanical scoring process.

3. The method of claim 1, wherein the step of scoring the first side of the transparent substrate comprises forming a pattern on the first side of the transparent substrate.

4. The method of claim 1, further comprising:
   selecting a mechanical scoring edge based upon a desired shape of a groove formed by the step of scoring the first side of the transparent substrate;
   wherein the step of scoring the first side of the transparent substrate is performed using a mechanical scoring process.

5. The method of claim 1, wherein the step of scoring the first side of the transparent substrate comprises forming an array of mesas on the first side of the transparent substrate.

6. The method of claim 1, wherein the transparent substrate is flexible.

7. The method of claim 1, wherein the transparent substrate has a refractive index in a range from about 1.6 to 1.8.

8. The method of claim 1, further comprising cleaning the transparent substrate subsequent to the step of scoring the first side of the transparent substrate, and prior to the step of disposing the OLED on the second side of the transparent substrate.

9. The method of claim 1, further comprising, prior to the step of disposing the OLED adjacent to the second side of the transparent substrate:
   fabricating the OLED on a second substrate which is different from the transparent substrate; and
   attaching the second substrate to the transparent substrate.

10. The method of claim 1, further comprising forming a thin-film barrier over the OLED.

11. The method of claim 1, wherein the step of scoring the first side of the transparent substrate is performed prior to the step of disposing the OLED on the second side of the transparent substrate.

12. The method of claim 1, wherein the scoring is performed as part of a roll-to-roll fabrication process.

13. The method of claim 1, further comprising disposing a planarization layer between the transparent substrate and the OLED.

14. The method of claim 1, further comprising disposing a barrier layer between the transparent substrate and the OLED.

15. The method of claim 1, further comprising:
   disposing a planarization layer between the transparent substrate and the OLED; and
   disposing a barrier layer between the transparent substrate and the OLED;
   wherein each of the transparent substrate, the planarization layer, and the barrier layer each has a refractive index in a range from about 1.6 to 1.8.

16. The method of claim 1, wherein the step of scoring the first side of the transparent substrate comprises:
   scoring the first side of the transparent substrate a first time using a first value of a scoring parameter; and
   scoring the first side of the transparent substrate a second time using a second value of the scoring parameter;
   wherein the scoring parameter is selected from the group consisting of: depth, spacing, and applied pressure.

17. A light-emitting device fabricated according to the method of claim 1.

18. The method of claim 5, further comprising forming secondary features on the top surface of each of the plurality of mesas.

19. The method of claim 5, wherein the step of forming the array of mesas further comprises forming a ridge on each of the plurality of mesas, which is elevated above a planar top surface of the mesa.

* * * * *